(12) United States Patent
Jang et al.

(10) Patent No.: US 9,197,202 B2
(45) Date of Patent: Nov. 24, 2015

(54) PHASE MIXING CIRCUIT, AND SEMICONDUCTOR APPARATUS AND SEMICONDUCTOR SYSTEM INCLUDING THE SAME

(71) Applicant: SK hynix Inc., Icheon-si Gyeonggi-do (KR)

(72) Inventors: Jae Min Jang, Icheon-si (KR); Yong Ju Kim, Icheon-si (KR); Dae Han Kwon, Icheon-si (KR); Kil Ho Cha, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/092,251

(22) Filed: Nov. 27, 2013

(65) Prior Publication Data

US 2015/0054558 A1   Feb. 26, 2015

(30) Foreign Application Priority Data

Aug. 20, 2013   (KR) .................. 10-2013-0098625

(51) Int. Cl.
*H03H 11/16*   (2006.01)
*H03K 3/00*   (2006.01)
*H03K 5/13*   (2014.01)

(52) U.S. Cl.
CPC ...................................... *H03K 5/131* (2013.01)

(58) Field of Classification Search
CPC ....... H03L 7/0814; H03L 7/089; H03K 5/132
USPC .......................... 327/156, 158, 231, 237, 250
See application file for complete search history.

(56) References Cited

U.S. PATENT DOCUMENTS

| 6,982,578 B2 * | 1/2006 | Lee | 327/158 |
| 7,046,059 B2 * | 5/2006 | Kwak | 327/158 |
| 7,868,671 B2 * | 1/2011 | Park | 327/158 |

FOREIGN PATENT DOCUMENTS

| KR | 101086502 B1 | 11/2011 |
| KR | 101086882 B1 | 11/2011 |

* cited by examiner

*Primary Examiner* — Diana J Cheng
(74) *Attorney, Agent, or Firm* — William Park & Associates Ltd.

(57) ABSTRACT

A phase mixing circuit includes a first mixing unit configured to mix phases of first and second clocks at a predetermined ratio, and generate a first mixed signal; a second mixing unit configured to mix phases of an inverted signal of the first clock and an inverted signal of the second clock at the predetermined ratio, and generate a second mixed signal; and an output unit configured to generate an output signal based on of the first and second mixed signals.

7 Claims, 7 Drawing Sheets

US 9,197,202 B2

PHASE MIXING CIRCUIT, AND SEMICONDUCTOR APPARATUS AND SEMICONDUCTOR SYSTEM INCLUDING THE SAME

CROSS-REFERENCES TO RELATED APPLICATION

The present application claims priority under 35 U.S.C. §119(a) to Korean application number 10-2013-0098625, filed on Aug. 20, 2013, in the Korean Intellectual Property Office, which is incorporated herein by reference in its entirety.

BACKGROUND

1. Technical Field

Various embodiments relate to a semiconductor apparatus, and more particularly, to a phase mixing circuit which mixes the phases of clocks, and a semiconductor apparatus and a semiconductor system including the same.

2. Related Art

In general, a semiconductor apparatus is configured to operate in synchronization with a clock. In order to precisely perform various complicated operations or precisely perform communication between devices electrically coupled with each other, a semiconductor apparatus uses a clock for correcting the phase thereof. By mixing phases of a plurality of clocks with different phases, the phase of the clock may be corrected.

FIG. 1 is a diagram schematically showing a configuration of a conventional phase mixing circuit 10. In FIG. 1, the phase mixing circuit 10 includes a first driver 11, a second driver 12, and an output unit 13. The first driver 11 changes the phase of a first clock CLK1 in response to control signals CODE<1:n> and inverted control signals CODEB<1:n>, and provides an output to an output node N1. The second driver 12 changes the phase of a second clock CLK2 in response to the control signals CODE<1:n> and the inverted control signals CODEB<1:n>, and provides an output to the output node N1. The output unit 13 generates an output signal MIXO from the outputs of the first driver 11 and the second driver 12.

Each of the first and second drivers 11 and 12 includes a plurality of switch inverters 20 as shown in FIG. 2. FIG. 2 shows a switch inverter 20 which may be included in the first driver 11. The switch inverter 20 includes a first switch transistor 21, a second switch transistor 22, and an inverting section 23. The first switch transistor 21 is constituted by a PMOS transistor and receives the inverted control signal CODEB<n>. The second switch transistor 22 is constituted by an NMOS transistor and receives the control signal CODE<n>. The inverting section 23 may invert the first clock CLK1 when the first and second switch transistors 21 and 22 are turned on, and output an output.

The switch inverters of the first driver 11 receive the inverted control signals CODEB<1:n> through first switch transistors, respectively, and receive the control signals CODE<1:n> through second switch transistors, respectively. The inverting sections of the switch inverters may commonly receive the first clock CLK1 and may be electrically coupled in parallel with one another. Similarly, the switch inverters of the second driver 12 receive the control signals CODE<1:n> through first switch transistors, respectively, and receive the inverted control signals CODEB<1:n> through second switch transistors, respectively. The inverting sections of the switch inverters may commonly receive the second clock CLK2 and may be electrically coupled in parallel with one another.

In the phase mixing circuit 10, the duty ratio of the output signal MIXO, in some instances, is not constant. The lack of a constant duty ratio of the output signal MIXO may be attributable to processing characteristics. For instance, when processing characteristics cause NMOS transistors to operate at a different pace than PMOS transistors, the duty ratio of the output signal MIXO may increase or decrease when compared to when the NMOS transistors and the PMOS transistors have the same processing characteristics.

FIG. 3 is a timing diagram showing operations of the conventional phase mixing circuit. FIG. 3 provides an example where each of the first and second drivers 11 and 12 includes four switch inverters and the phases of the first and second clocks CLK1 and CLK2 are mixed at the ratio of 3:1. In FIG. 3, case A shows the waveform of an output signal when the processing characteristics of NMOS transistors and PMOS transistors are the same. Case B shows the waveform of an output signal when NMOS transistors have processing characteristics that are slower than PMOS transistors. Case C shows the waveform of an output signal when NMOS transistors have processing characteristics that are quicker than PMOS transistors.

In case B, the first clock CLK1 and the second clock CLK2 are mixed with a mixing ratio of 3:1 while the first clock CLK1 has a high level and the second clock CLK2 has a low level. Because, however, the operations of the NMOS transistors are relatively slower, the actual mixing ratio is about 2.4:1, and the actual mixing ratio when the first clock CLK1 has a low level and the second clock CLK2 has a high level is about 3.6:1. Accordingly, the output signal has a delayed rising time and an early falling time in comparison with the case of A. Thus, a lower duty ratio distortion occurs.

In case C, the first clock CLK1 and the second clock CLK2 are mixed with a mixing ratio of 3:1 while the first clock CLK1 has a high level and the second clock CLK2 has a low level. Because, however, the operations of the NMOS transistors are relatively quicker, an actual mixing ratio is about 3.6:1, and an actual mixing ratio when the first clock CLK1 has a low level and the second clock CLK2 has a high level is about 2.4:1. Accordingly, the output signal has an early rising timing and a delayed falling timing in comparison with the case of A. Thus, a higher duty ratio distortion occurs.

SUMMARY

A phase mixing circuit which can compensate for a difference in processing characteristics between an NMOS transistor and a PMOS transistor and output a clock signal with a precise duty ratio regardless of processing characteristics, and a semiconductor apparatus and a semiconductor system including the same are described herein.

In an embodiment of the present invention, a phase mixing circuit includes: a first mixing unit configured to mix phases of first and second clocks at a predetermined ratio, and generate a first mixed signal; a second mixing unit configured to mix phases of an inverted signal of the first clock and an inverted signal of the second clock at the predetermined ratio, and generate a second mixed signal; and an output unit configured to generate an output signal based on the first and second mixed signals.

In an embodiment of the present invention, a phase mixing circuit includes: a first driving section configured to change a phase of a first clock in response to control signals; a first compensating driving section configured to change a phase of an inverted signal of the first clock in response to the control signals; a second driving section configured to change a phase of a second clock in response to the control signals; and a second compensating driving section configured to change a phase of an inverted signal of the second clock in response to the control signals, wherein an output signal is generated based on outputs of the first and second driving sections and the first and second compensating driving sections.

In an embodiment of the present invention, a semiconductor apparatus includes: an input clock generation unit configured to receive an input clock, and generate first and second clocks which have a predetermined phase difference; a first delay line configured to delay the first clock in response to delay control signals, and generate first and second delayed clocks; a first phase mixing unit configured to mix phases of the first and second delayed clocks in response to control signals and mix phases of inverted signals of the first and second delayed clocks, and generate a first mixed clock; a second delay line configured to delay the second clock in response to the delay control signals, and generate third and fourth delayed clocks; a second phase mixing unit configured to mix phases of the third and fourth delayed clocks in response to the control signals and mix phases of inverted signals of the third and fourth delayed clocks, and generate a second mixed clock; and a multi-phase clock generation unit configured to correct a duty ratio of the first and second mixed clocks, and generate multi-phase clocks.

In an embodiment of the present invention, a semiconductor system includes: a host; a memory; and a controller configured to relay communication between the host and the memory, wherein the host, the memory and the controller communicate with one another using a first clock, and at least one of the host, the memory and the controller includes a phase mixing circuit, and wherein the phase mixing circuit includes: a first mixing unit configured to mix phases of the first clock and a second clock which has a predetermined phase difference from the first clock, at a predetermined ratio, and generate a first mixed signal; a second mixing unit configured to mix phases of an inverted signal of the first clock and an inverted signal of the second clock at the predetermined ratio, and generate a second mixed signal; and an output unit configured to generate an output signal based on the first and second mixed signals.

BRIEF DESCRIPTION OF THE DRAWINGS

Features, aspects, and embodiments are described in conjunction with the attached drawings, in which.

DETAILED DESCRIPTION

Hereinafter, a phase mixing circuit, and a semiconductor apparatus and a semiconductor system including the same according to disclosed embodiments will be described below with reference to the accompanying drawings through example embodiments.

Figure 1:
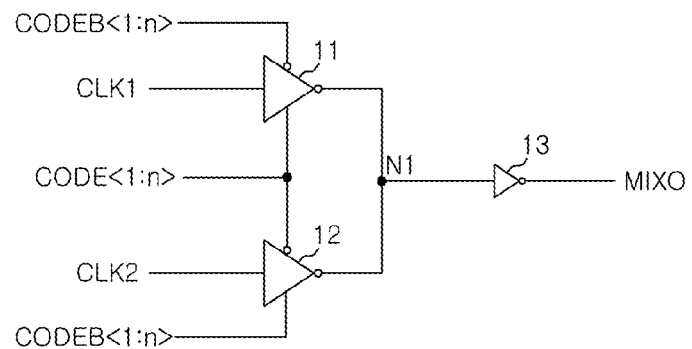
FIG. 1 is a diagram schematically showing a configuration of a conventional phase mixing circuit.
Figure 2:
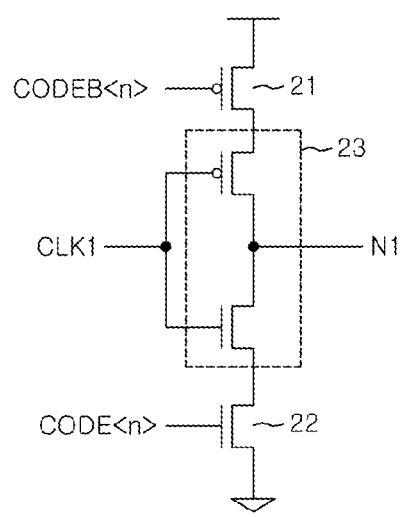
FIG. 2 is a diagram showing a configuration of a conventional switch inverter.
Figure 3:
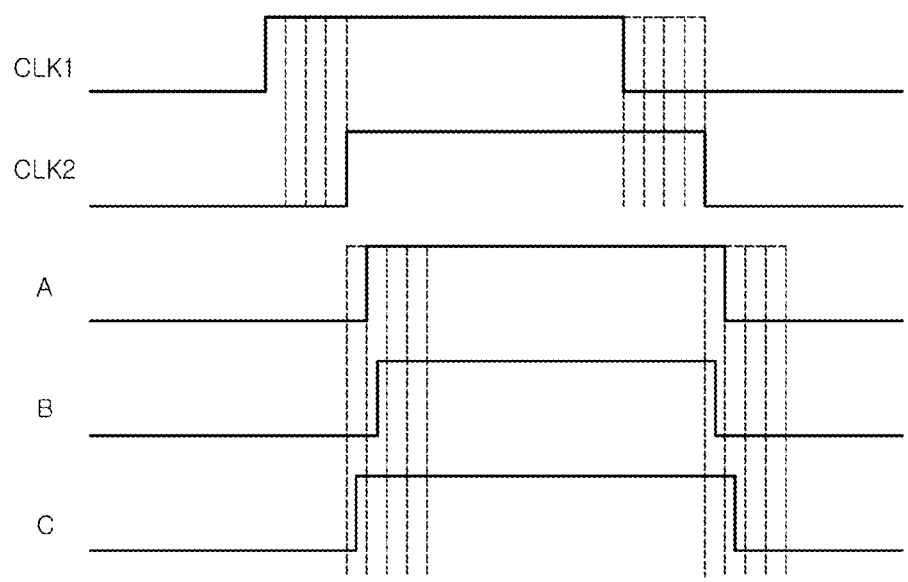
FIG. 3 is a timing diagram of the operations of a conventional phase mixing circuit showing that a duty ratio changes as the phases of clocks are mixed.
Figure 4:
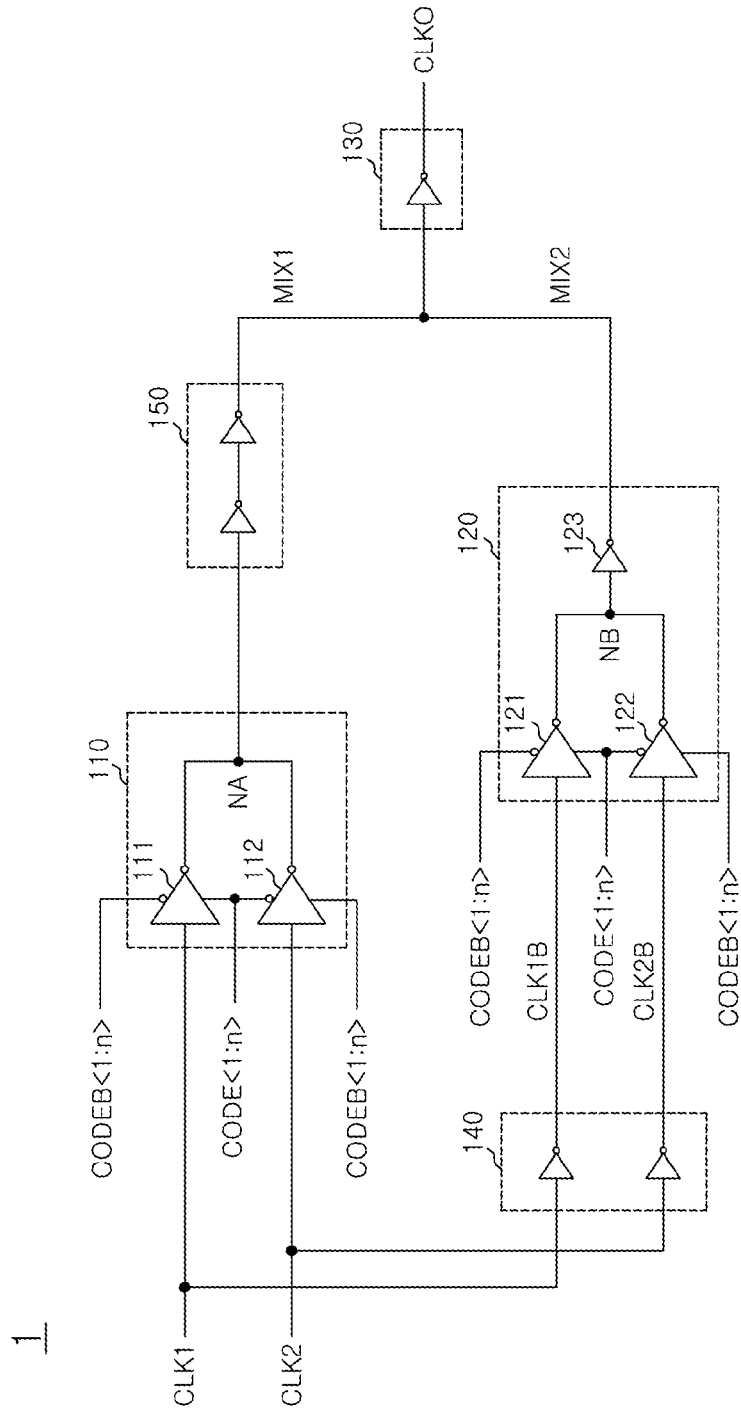
FIG. 4 is a diagram schematically showing a configuration of a phase mixing circuit in accordance with an embodiment of the present disclosure.

In FIG. 4, a phase mixing circuit 1 in accordance with an embodiment of the present disclosure includes a first mixing unit 110, a second mixing unit 120, and an output unit 130. The first mixing unit 110 receives a first clock CLK1 and a second clock CLK2. The first mixing unit 110 mixes phases of the first and second clocks CLK1 and CLK2 at a predetermined ratio, and the first mixing unit 110 generates a first mixed signal MIX1. The first mixing unit 110 may mix the phases of the first and second clocks CLK1 and CLK2 at the predetermined ratio in response to control signals CODE<1:n>.

The second mixing unit 120 receives an inverted signal CLK1B of the first clock CLK1 and an inverted signal CLK2B of the second clock CLK2. The second mixing unit 120 mixes phases of the inverted signals CLK1B and CLK2B of the first and second clocks CLK1 and CLK2 at the predetermined ratio, and the second mixing unit 120 generates a second mixed signal MIX2. The second mixing unit 120 may mix phases of the inverted signals CLK1B and CLK2B of the first and second clocks CLK1 and CLK2 at the predetermined ratio in response to the control signals CODE<1:n>. The output unit 130 may be configured to receive the first mixed signal MIX1 and the second mixed signal MIX2 and generate an output signal CLKO based on the first and second mixed signals MIX1 and MIX2. The control signals CODE<1:n> may be inputted through a control circuit (not shown) and the control signals CODE<1:n> may include a plurality of code signals.

The first mixing unit 110 includes first and second driving sections 111 and 112. The first driving section 111 may be configured to receive the first clock CLK1 and change the phase of the first clock CLK1 in response to the control signals CODE<1:n>. The first driving section 111 may comprise a plurality of switch inverters. The first driving section 111 may include a number of switch inverters corresponding to a number of the control signals CODE<1:n>. The number of enabled switch inverters which constitute the first driving section 111 may be determined in response to the number of control signals CODE<1:n>. In one embodiment, the switch inverters may also be enabled by receiving inverted signals CODEB<1:n> of the control signals CODE<1:n> through first switch transistors, and receiving the control signals CODE<1:n> through second switch transistors. As the number of enabled switch inverters increases, the phase of the first clock CLK1 may be delayed less. As the number of disabled switch inverters increases, the phase of the first clock CLK1 may be delayed more. Thus, the first driving section 111 may control an amount by which the phase of the first clock CLK1 is delayed and enabling or disabling switch inverters in response to the control signals CODE<1:n>. In one example, the first switch transistors refer to switches which include PMOS transistors, and the second switch transistors refer to switches which include NMOS transistors.

The second driving section 112 may be configured to receive the second clock CLK2 and change the phase of the second clock CLK2 in response to the control signals CODE<1:n>. Similar to the first driving section 111, the second driving section 112 may comprise a plurality of switch inverters. The switch inverters of the second driving section 112 may receive the control signals CODE<1:n> through first switch transistors, and receive the inverted signals CODEB<1:n> of the control signals CODE<1:n> through second switch transistors. Accordingly, the number of enabled switch transistors of the first driving section 111 the number of enabled switch transistors of the second driving section 112 may be inversely proportional to each other. For instance, when the first driving section 111 and the second driving section 112 include 4 switch inverters, if 3 switch inverters among the switch inverters of the first driving section 111 are enabled in response to the control signals CODE<1:n>, 1 switch inverter among the switch inverters of the second driving section 112 may be enabled. Therefore, the first and second driving sections 111 and 112 may delay phases of the first and second clocks CLK1 and CLK2 different amounts, where the phase delay may be in accordance with the control signals CODE<1:n>. Accordingly, the first and second driving sections 111 and 112 may change a ratio with which the phases of the first and second clocks CLK1 and CLK2 are mixed. The outputs of the first and second driving sections 111 and 112 are mixed at a first output node NA and are provided as the first mixed signal MIX1.

The second mixing unit 120 includes a third driving section 121, a fourth driving section 122, and an inverting driving section 123. The third driving section 121 and the fourth driving section 122 respectively have the same or substantially similar configurations as the first driving section 111 and the second driving section 112, and are configured to receive the control signals CODE<1:n> and the inverted signals CODEB<1:n> of the control signals CODE<1:n> in a same or substantially similar same manner. However, the third driving section 121 receives the inverted signal CLK1B of the first clock CLK1, and the fourth driving section 122 receives the inverted signal CLK2B of the second clock CLK2. Thus, the third driving section 121 may change the phase of the inverted signal CLK1B of the first clock CLK1 in response to the control signals CODE<1:n> and provide an output to a second output node NB, and the fourth driving section 122 may change the phase of the inverted signal CLK2B of the second clock CLK2 in response to the control signals CODE<1:n> and provide an output to the second output node NB. Since the third and fourth driving sections 121 and 122 perform phase mixing operations for the inverted signals CLK1B and CLK2B which have a phase difference of 180° from the first and second clocks CLK1 and CLK2, the phase mixing operations for the inverted signals CLK1B and CLK2B of the first and second clocks CLK1 and CLK2 may be performed with processing characteristics substantially opposite to the processing characteristics of the first and second driving sections 111 and 112. The third driving section 121 may compensate for a duty ratio distortion attributable to processing characteristics in the first driving section 111, and the fourth driving section 122 may compensate for a duty ratio distortion attributable to processing characteristics in the second driving section 112. Accordingly, the third and fourth driving sections 121 and 122 respectively serve as compensating driving sections for the first and second driving sections 111 and 112. Hereinbelow, the third driving section may also be referred to as a first compensating driving section, and the fourth driving section may also be referred to as a second compensating driving section. Thus, the third driving section and the first compensating driving section may refer to the same component element, and the fourth driving section and the second compensating driving section may refer to the same component element. The inverting driving section 123 is configured to invert the outputs of the third and fourth driving sections 121 and 122 and generate the second mixed signal MIX2.

The output unit 130 is configured to receive the first mixed signal MIX1 and the second mixed signal MIX2, mix the phases of the first and second mixed signals MIX1 and MIX2 at the ratio of 1:1, and generate the output signal CLKO.

In FIG. 4, the phase mixing circuit 1 may further include an inverting input unit 140. The inverting input unit 140 may be configured to receive the first and second clocks CLK1 and CLK2, invert the first and second clocks CLK1 and CLK2, and generate the inverted signal CLK1B of the first clock CLK1 and the inverted signal CLK2B of the second clock CLK2. Also, the phase mixing circuit 1 may further include a delay unit 150. The delay unit 150 may be configured to delay the first mixed signal MIX1. The second mixing unit 120 additionally includes the inverting driving section 123 which inverts the outputs of the third and fourth driving sections 121 and 122, so that the second mixed signal MIX2 may be mixed with the first mixed signal MIX1. Further, when considering a disposition of the inverting input unit 140, the delay time of a path along which the phases of the inverted signals CLK1B and CLK2B are mixed to generate the second mixed signal MIX2 is longer than the delay time of a path along which the phases of the first and second clocks CLK1 and CLK2 are mixed to generate the first mixed signal MIX1. Accordingly, the phase mixing circuit 1 may include the delay unit 150 to substantially equalize delay times caused by the paths along which the first and second mixed signals MIX1 and MIX2 are generated. Although FIG. 4 illustrates the delay unit 150 as including inverters, the delay unit 150 may include configurations of switch inverters that maximally and/or precisely match the delay times caused by the paths along which first and second mixed signals MIX1 and MIX2. Furthermore, the inverting input unit 140 may be configured by switch inverters.

Figure 5:
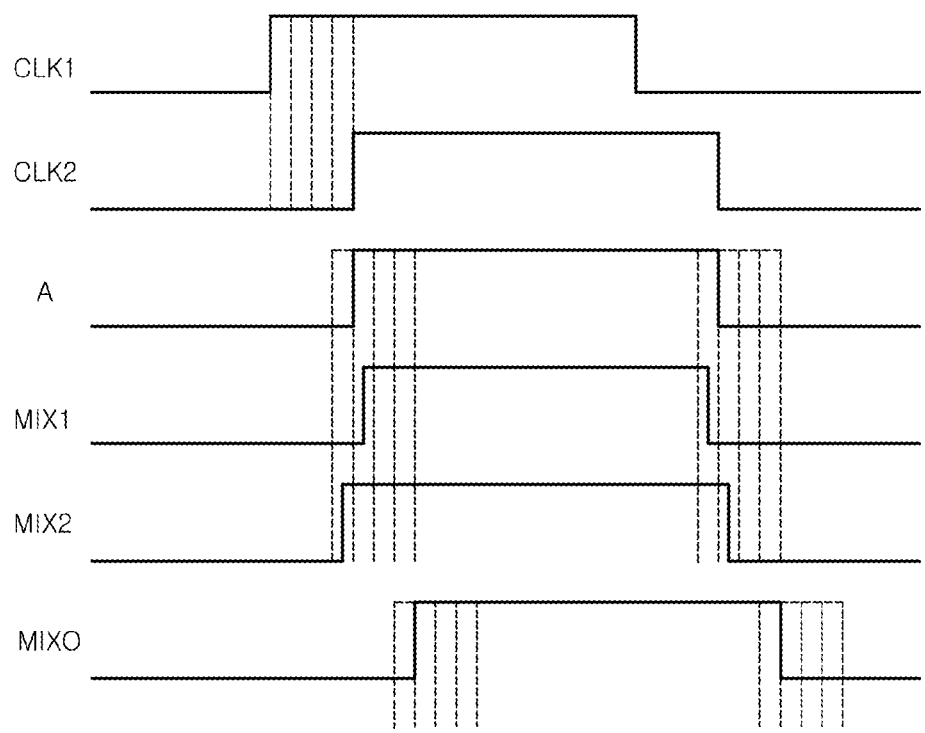
FIG. 5 is a timing diagram showing operations of a phase mixing circuit in accordance with an embodiment of the present disclosure.

FIG. 5 is a diagram showing operations of the phase mixing circuit 1 of FIG. 4. In FIG. 5, it is assumed that each of the first to fourth driving sections 111, 112, 121 and 122 includes 4 switch inverters and NMOS transistors have processing characteristics slower than PMOS transistors. Also, in the example of FIG. 5, the first and second clocks CLK1 and CLK2 are mixed at the ratio of 3:1. Accordingly, 3 switch inverters among 4 switch inverters of each of the first and third driving sections 111 and 121 may be enabled and 1 switch inverter among 4 switch inverters of each of the second and fourth driving sections 112 and 122 may be enabled, in response to the control signals CODE<1:n>.

The first mixing unit 110 generates the first mixed signal MIX1 which has a later rising time and an earlier falling time in comparison with a normal case A. Hence, the first mixed signal MIX1 has a duty ratio distortion shorter than the normal case A, where the duty ratio of the normal case may serve as a benchmark. Since the second mixing unit 120 performs the phase mixing operations for the inverted signals CLK1B and CLK2B of the first and second clocks CLK1 and CLK2, the second mixing unit 120 may generate the second mixed signal MIX2 which has a duty ratio distortion opposite to the first mixed signal MIX1. Hence, the second mixed signal MIX2 has a duty ratio distortion longer than the normal case A. The output unit 130 mixes the first and second mixed signals MIX1 and MIX2 at the ratio of 1:1, and generates the output signal CLKO. Accordingly, the output signal CLKO may be a signal with the same duty ratio as the normal case A.

The first and second mixing units 110 and 120 may offset the duty ratio distortions which occur attributable to the processing characteristics.

Figure 6:
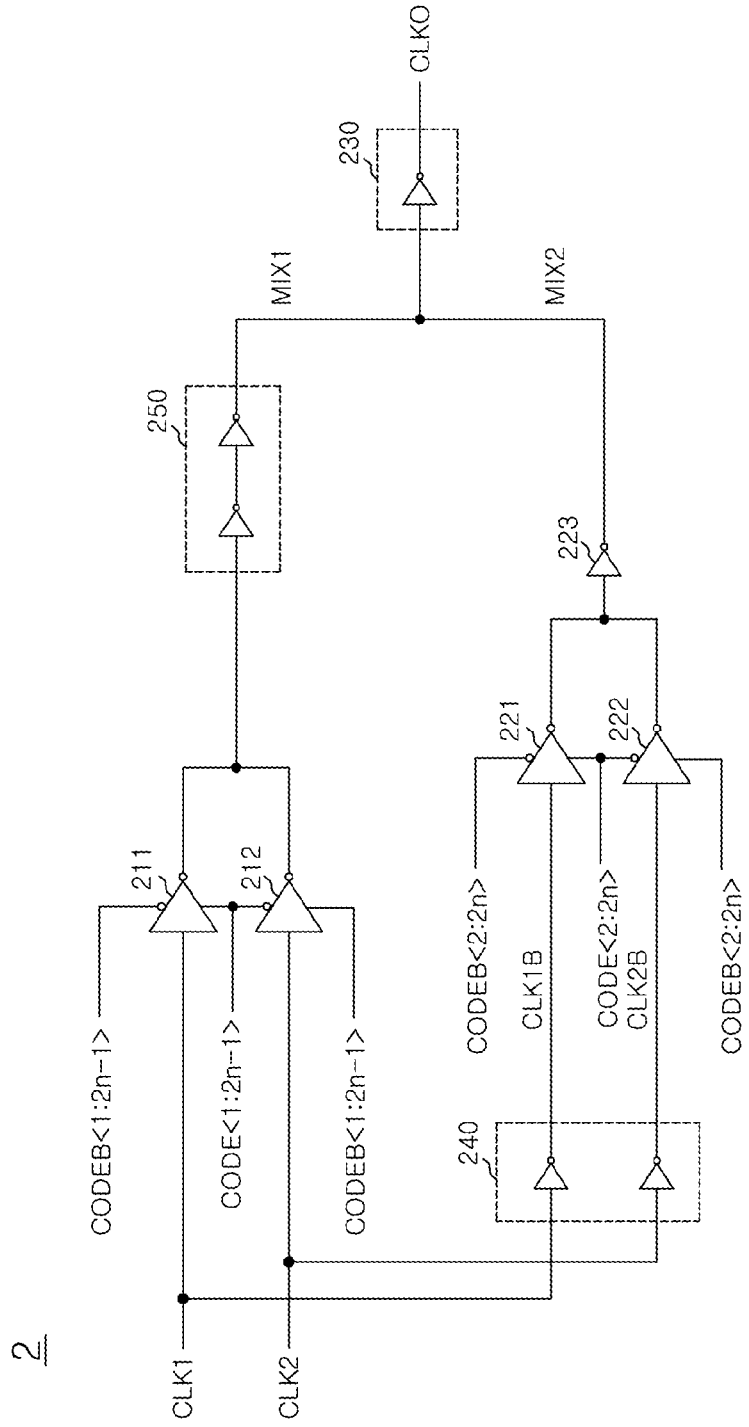
FIG. 6 is a diagram schematically showing a configuration of a phase mixing circuit in accordance with an embodiment of the present disclosure.

FIG. 6 is a diagram schematically showing a configuration of a phase mixing circuit 2 in accordance with an embodiment of the present disclosure. In FIG. 6, the phase mixing circuit 2 may have the same or substantially similar configuration as the phase mixing circuit 1 of FIG. 4. The phase mixing circuit 2 may include a first driving section 211, a second driving section 212, a first compensating driving section 221, a second compensating driving section 222, an inverting driving section 223, an output unit 230, an inverting input unit 240, and a delay unit 250. However, the first driving section 211 and the second driving section 212 may receive odd-numbered codes CODE<1:2n−1> (n is an integer that is equal to or larger than 2) among control signals CODE<1:2n>, and the first compensating driving section 221 and the second compensating driving section 222 may receive even-numbered codes CODE<2:2n> among the control signals CODE<1:2n>.

Assuming that each of the first and second driving sections 211 and 212 and the first and second compensating driving sections 221 and 222 includes 8 switch inverters, since the first and second driving sections 211 and 212 receive the odd-numbered codes CODE<1:2n−1>, only a maximum of 4 switch inverters among the 8 switch inverters of the first and second driving sections 211 and 212 may be enabled. Similarly, since the first and second compensating driving sections 221 and 222 receive the even-numbered codes CODE<2:2n>, only a maximum of 4 switch inverters among the 8 switch inverters of the first and second compensating driving sections 221 and 222 may be enabled.

If the control signals CODE<1:2n> are inputted as logic levels H, H, L, L, L, L, L and L to mix the phases of first and second clocks CLK1 and CLK2 at the ratio of 1:3, 1 of the switch inverters of the first driving section 211 may be enabled, and 3 of the switch inverters of the second driving section 212 may be enabled. Similarly, 1 of the switch inverters of the first compensating driving section 221 may be enabled, and 3 of the switch inverters of the second compensating driving section 222 may be enabled. Accordingly, a first mixed signal MIX1 is generated as the phases of the first and second clocks CLK1 and CLK2 are mixed at the ratio of 1:3, and a second mixed signal MIX2 is generated as the phases of inverted signals CLK1B and CLK2B of the first and second clocks CLK1 and CLK2 are mixed at the ratio of 1:3. Because the first and second mixed signals MIX1 and MIX2 are mixed at the ratio of 1:1 by the output unit 230, an output signal CLKO in which the phases of the first and second clocks CLK1 and CLK2 are mixed at the ratio of 1:3 may be finally generated.

In another instance, if the control signals CODE<1:2n> are inputted as logic levels H, H, H, L, L, L, L and L to mix the phases of the first and second clocks CLK1 and CLK2 at the ratio of 3:5, 2 of the switch inverters of the first driving section 211 may be enabled, and 2 of the switch inverters of the second driving section 212 may be enabled. Therefore, the first mixed signal MIX1, which are generated as the phases of the first and second clocks CLK1 and CLK2, are mixed at the ratio of 1:1. In response to the control signals CODE<1:2n>, 1 of the switch inverters in the first compensating driving section 221 may be enabled, and 3 of the switch inverters in the second compensating driving section 222 may be enabled. Therefore, the second mixed signal MIX2 may be generated as the phases of the inverted signals CLK1B and CLK2B are mixed at the ratio of 1:3. Since the first and second mixed signals MIX1 and MIX2 are mixed at the ratio of 1:1 by the output unit 230, the output signal CLKO is generated with phases of the first and second clocks CLK1 and CLK2 mixed at the ratio of 1.5:2.5. Because the phase mixing circuit 2 may operate with half of the switch inverters using the same control signals CODE<1:2n>, consumption of current for mixing the phases of the first and second clocks CLK1 and CLK2 may be further reduced.

Figure 7:
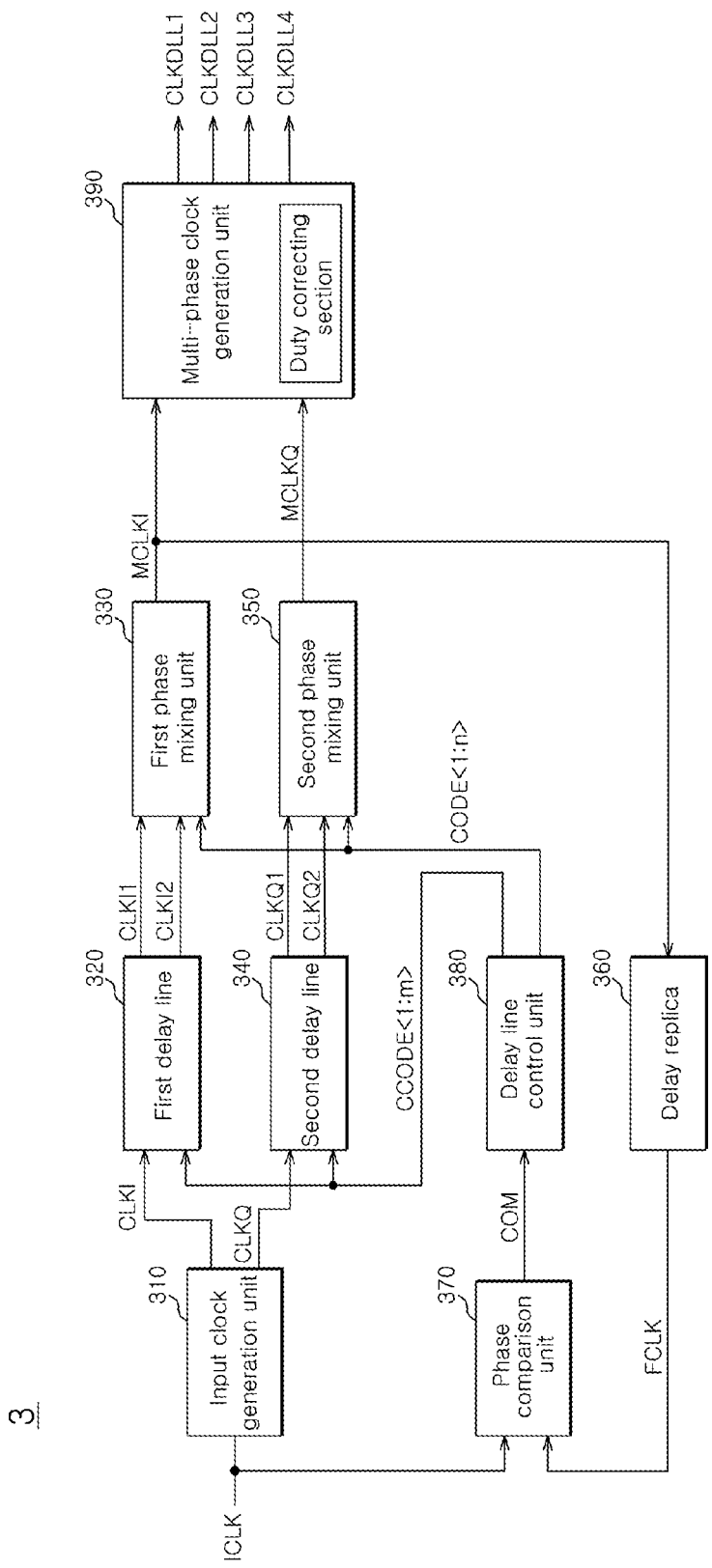
FIG. 7 is a block diagram showing a configuration of a delay locked loop in accordance with an embodiment of the present disclosure.

FIG. 7 is a block diagram showing a configuration of a delay locked loop 3 in accordance with another embodiment of the present disclosure. In FIG. 7, the delay locked loop 3 may include an input clock generation unit 310, a first delay line 320, a first phase mixing unit 330, a second delay line 340, and a second phase mixing unit 350. The input clock generation unit 310 may be configured to receive an input clock ICLK and generate first and second clocks CLKI and CLKQ from the input clock ICLK. The input clock generation unit 310 may generate the first and second clocks CLKI and CLKQ which may have a predetermined phase difference. In an embodiment of the present disclosure, the predetermined phase difference may be equal to or smaller than 90°. As an operation of a semiconductor apparatus is sped up, the frequency of an operating clock is substantially increased. Accordingly, if a delay locking operation is performed for only one clock, phases of multi-phase clocks may be generated in an imprecise manner. The delay locked loop 3, however, may precisely generate multi-phase clocks with desired phases by generating the first and second clocks CLKI and CLKQ with the predetermined phase difference through the input clock generation unit 310 and then performing a delay locking operation for each of the first and second clocks CLKI and CLKQ.

The first delay line 320 is configured to delay the first clock CLKI in response to delay control signals CCODE<1:m>, and generate first and second delayed clocks CLKI1 and CLKI2. The first phase mixing unit 330 is configured to receive the first and second delayed clocks CLKI1 and CLKI2 and to perform a phase mixing operation for the first and second delayed clocks CLKI1 and CLKI2 in response to control signals CODE<1:n>. The first phase mixing unit 330 generates a first mixed clock MCLKI by mixing the phases of the first and second delayed clocks CLKI1 and CLKI2. The first phase mixing unit 330 may generate the first mixed clock MCLKI by mixing the phases of the first and second delayed clocks CLKI1 and CLKI2 and mixing the phases of inverted signals of the first and second delayed clocks CLKI1 and CLKI2. The first phase mixing unit 330 may be the same or substantially similar in terms of configuration and operation as the phase mixing circuits 1 and 2 shown in FIGS. 4 and 6.

The second delay line 340 may be configured to delay the second clock CLKQ in response to the delay control signals CCODE<1:m> and generate third and fourth delayed clocks CLKQ1 and CLKQ2. The second phase mixing unit 350 is configured to receive the third and fourth delayed clocks CLKQ1 and CLKQ2 and perform a phase mixing operation for the third and fourth delayed clocks CLKQ1 and CLKQ2 in response to the control signals CODE<1:n>. The second phase mixing unit 350 generates a second mixed clock MCLKQ by mixing the phases of the third and fourth delayed clocks CLKQ1 and CLKQ2. The second phase mixing unit 350 may generate the second mixed clock MCLKQ by mixing the phases of the third and fourth delayed clocks CLKQ1 and CLKQ2 and mixing the phases of inverted signals of the third and fourth delayed clocks CLKQ1 and CLKQ2. The second phase mixing unit 350 may be the same or substantially similar in terms of configuration and operation as the phase mixing circuits 1 and 2 shown in FIGS. 4 and 6.

The delay locked loop 3 may delay the phases of clocks by using a coarse delay or a fine delay. The first and second delay lines 320 and 340 may constitute the coarse delay, and the first and second phase mixing units 330 and 350 may constitute the fine delay. Because the first and second phase mixing units 330 and 350 perform the phase mixing operations not only for the respective delayed clocks CLKI1, CLKI2, CLKQ1 and CLKQ2 but also for the inverted signals of the respective delayed clocks CLKI1, CLKI2, CLKQ1 and CLKQ2, it is possible to correct the duty ratio of the first and second mixed clocks MCLKI and MCLKQ. Accordingly, the first and second phase mixing units 330 and 350 may not only serve as the fine delay but also perform the function of a duty correction circuit.

The delay locked loop 3 may further include a delay replica 360, a phase comparison unit 370, a delay line control unit 380, and a multi-phase clock generation unit 390. The delay replica 360 is configured to delay the first mixed clock MCLKI by a predetermined delay amount and output a feedback clock FCLK. The predetermined delay amount of the delay replica 360 may be acquired by modeling the transmission path of a clock. The phase comparison unit 370 may be configured to compare the phases of the input clock ICLK and the feedback clock FCLK and generate a phase comparison signal COM. The delay line control unit 380 may be configured to generate the delay control signals CCODE<1:m> and the control signals CODE<1:n> based on the phase comparison signal COM.

The multi-phase clock generation unit 390 is configured to receive the first and second mixed clocks MCLKI and MCLKQ, and generate a plurality of multi-phase clocks CLKDLL1 to CLKDLL4. The multi-phase clock generation unit 390 may generate the plurality of multi-phase clocks CLKDLL1 to CLKDLL4 having a phase difference of 90° with one another, based on the first and second mixed clocks MCLKI and MCLKQ. The multi-phase clock generation unit 390 may additionally include a duty correcting section and may perform a duty correcting function for correcting the duty ratio between the first and second mixed clocks MCLKI and MCLKQ.

Figure 8:
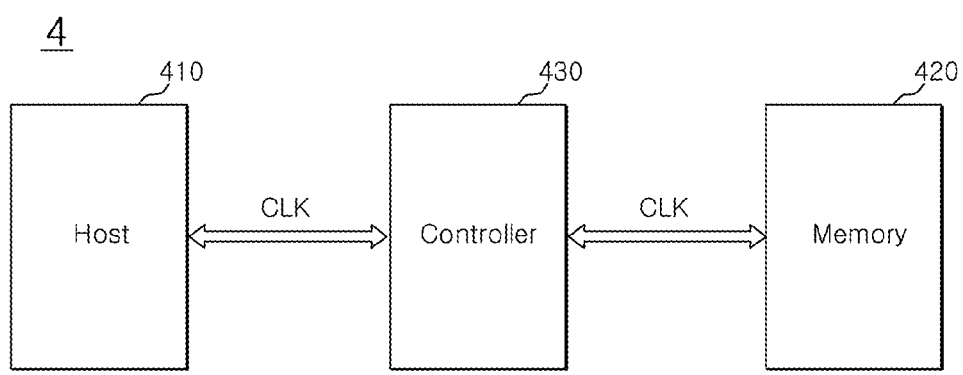
FIG. 8 is a block diagram showing a configuration of a semiconductor system in accordance with an embodiment of the present disclosure.

FIG. 8 is a block diagram schematically showing the configuration of a semiconductor system 4 in accordance with an embodiment of the present disclosure. In FIG. 8, the semiconductor system 4 includes a host 410, a memory 420, and a controller 430. The host 410 may provide commands, addresses, data, and so forth to access the memory 420. The memory 420 may store or output data based on the commands and the addresses. The controller 430 relays communication between the host 410 and the memory 420.

The host 410, the memory 420 and the controller 430 may operate based one a clock CLK. Thus, in order for the host 410, the memory 420 and the controller 430 to perform precise data communication among them, it is necessary to control the phase of the clock CLK or precisely correct a duty ratio. To this end, the phase mixing circuits 1 and 2 shown in FIGS. 4 and 6 and the delay locked loop shown in FIG. 7 may be provided in at least one of the host 410, the memory 420 and the controller 430. Furthermore, the phase mixing circuits 1 and 2 in accordance with embodiments of the present disclosure are not limited to the illustrations of the drawings, and may be applied to all semiconductor apparatuses which use a clock or mix the phases of signals.

While certain embodiments have been described above, it will be understood to those skilled in the art that the embodiments described are by way of example only. Accordingly, the phase mixing circuit, and the semiconductor apparatus and the semiconductor system including the same described herein should not be limited based on the described embodiments. Rather, the phase mixing circuit, and the semiconductor apparatus and the semiconductor system including the same described herein should only be limited in light of the claims that follow when taken in conjunction with the above description and accompanying drawings.

What is claimed is:

1. A phase mixing circuit comprising:
   a first mixing unit configured to mix phases of first and second clocks at a predetermined ratio, and generate a first mixed signal;
   an inverting input unit configured to receive the first and second clocks, and generate an inverted signal of the first clock and an inverted signal of the second clock;
   a second mixing unit configured to mix phases of the inverted signal of the first clock and the inverted signal of the second clock at the predetermined ratio;
   an inverting driving section configured to receive output of the second mixing unit, and generate a second mixed signal;
   a delay unit configured to delay the first mixed signal, wherein a delay amount of the delay unit corresponds to delay amount of the inverting input unit and the inverting driving section; and
   an output unit configured to generate an output signal based on outputs of the delay unit and the inverting driving section.

2. The phase mixing circuit according to claim 1, wherein the first mixing unit comprises:
   a first driving section configured to change the phase of the first clock in response to control signals; and
   a second driving section configured to change the phase of the second clock in response to the control signals,
   wherein the first mixed signal is generated from outputs of the first and second driving sections.

3. The phase mixing circuit according to claim 1, wherein the second mixing unit comprises:
   a third driving section configured to change the phase of the inverted signal of the first clock in response to the control signals; and
   a fourth driving section configured to change the phase of the inverted signal of the second clock in response to the control signals.

4. The phase mixing circuit according to claim 1, wherein:
   the first mixing unit is configured to generate the first mixed signal with a duty ratio shorter than a benchmark duty ratio;
   the second mixing unit is configured to generate the second mixed signal with a duty ration longer than the benchmark duty ratio;
   the output unit is configured generating an output signal with a same duty ratio as the benchmark duty ratio.

5. A phase mixing circuit comprising:
   an inverting input unit configured to invert a first clock and a second clock, and generate inverted signals of the first and second clocks;
   a first driving section configured to change a phase of the first clock in response to control signals and inverted control signals;
   a first compensating driving section configured to change a phase of the inverted signal of the first clock in response to the control signals and the inverted control signals;
   a second driving section configured to change a phase of the second clock in response to the control signals and the inverted control signals;

a second compensating driving section configured to change a phase of the inverted signal of the second clock in response to the control signals and the inverted control signals;

a delay unit configured to delay the outputs of the first and second driving sections, and generate a first mixed signal; and an inverting driving section configured to receive the outputs of the first and second compensating driving sections, and generate a second mixed signal.

6. The phase mixing circuit according to claim 5, further comprising:

an output unit configured to receive the first mixed signal and the second mixed signal, and generate the output signal.

7. The phase mixing circuit according to claim 5, wherein a delay amount of the delay unit corresponds to delay amount of the inverting input unit and the inverting driving section.

* * * * *